United States Patent [19]

Male et al.

[11] Patent Number: 5,412,328
[45] Date of Patent: May 2, 1995

[54] NON-CONTACT CURRENT INJECTION APPARATUS AND METHOD FOR USE WITH LINEAR BIPOLAR CIRCUITS

[75] Inventors: Barry J. Male, West Granby; Douglas L. Anneser, East Granby, both of Conn.

[73] Assignee: United Technologies Corporation, Hartford, Conn.

[21] Appl. No.: 267,296

[22] Filed: Jun. 29, 1994

Related U.S. Application Data

[63] Continuation of Ser. No. 999,610, Dec. 31, 1992, abandoned.

[51] Int. Cl.[6] .......................................... G01R 31/28
[52] U.S. Cl. ................................. 324/752; 324/96; 324/765
[58] Field of Search ............ 324/765, 752, 753, 158.1, 324/96; 250/205; 315/151

[56] References Cited

U.S. PATENT DOCUMENTS

| | | | |
|---|---|---|---|
| 4,698,587 | 10/1987 | Burns et al. | 324/765 |
| 4,755,748 | 7/1988 | Lin | 324/158 D |
| 4,768,073 | 8/1988 | Adams | 257/48 |
| 4,912,052 | 3/1990 | Miyoshi et al. | 437/8 |
| 5,012,314 | 4/1991 | Tobita et al. | 250/205 |
| 5,067,798 | 11/1991 | Tomoyasu | 324/158.1 |

FOREIGN PATENT DOCUMENTS 0483983 5/1992 European Pat. Off. .

OTHER PUBLICATIONS

"Effects of Secondary Laser Illumination During the Transient Measurement in Optical and Electrical Deep Level Transient Spectroscopy", Applied Physics Letters, vol. 59, No. 15, 7 Oct. 1991, pp. 1861–1863.

"Tests of Hermetically Sealed LSI/VLSI Devices by Laser Photoexitation Logic Analysis", Henley, F. J., Paper 16 B.3, 1986 International Test Conference, IEEE.

*Primary Examiner*—Ernest F. Karlsen
*Attorney, Agent, or Firm*—Richard H. Kosakowski; Holland & Associates

[57] ABSTRACT

The present invention relates to a non-contact current injection apparatus and a method for using the same with linear integrated bipolar circuits. The current injection apparatus has two modes: a calibration mode and an injection mode. The apparatus includes an illumination source for emitting photons toward an electronic component at a desired site for inducing a current in the electronic component. The apparatus further includes a control loop for generating a voltage control signal which causes the illumination source to illuminate to a desired level and a feedback loop which monitors the current induced in the electronic component and compares it or some other end effect to a desired current or end effect. The apparatus also includes a storage device for retaining information about the calibration sequence. The method for using the apparatus broadly comprises calibrating the apparatus using a test array having a series of calibration sites with a target at each site, providing an intensity control signal to the illumination source, illuminating a target at one of the calibration sites, and monitoring the end effect generated in the target by the photon emissions.

10 Claims, 5 Drawing Sheets

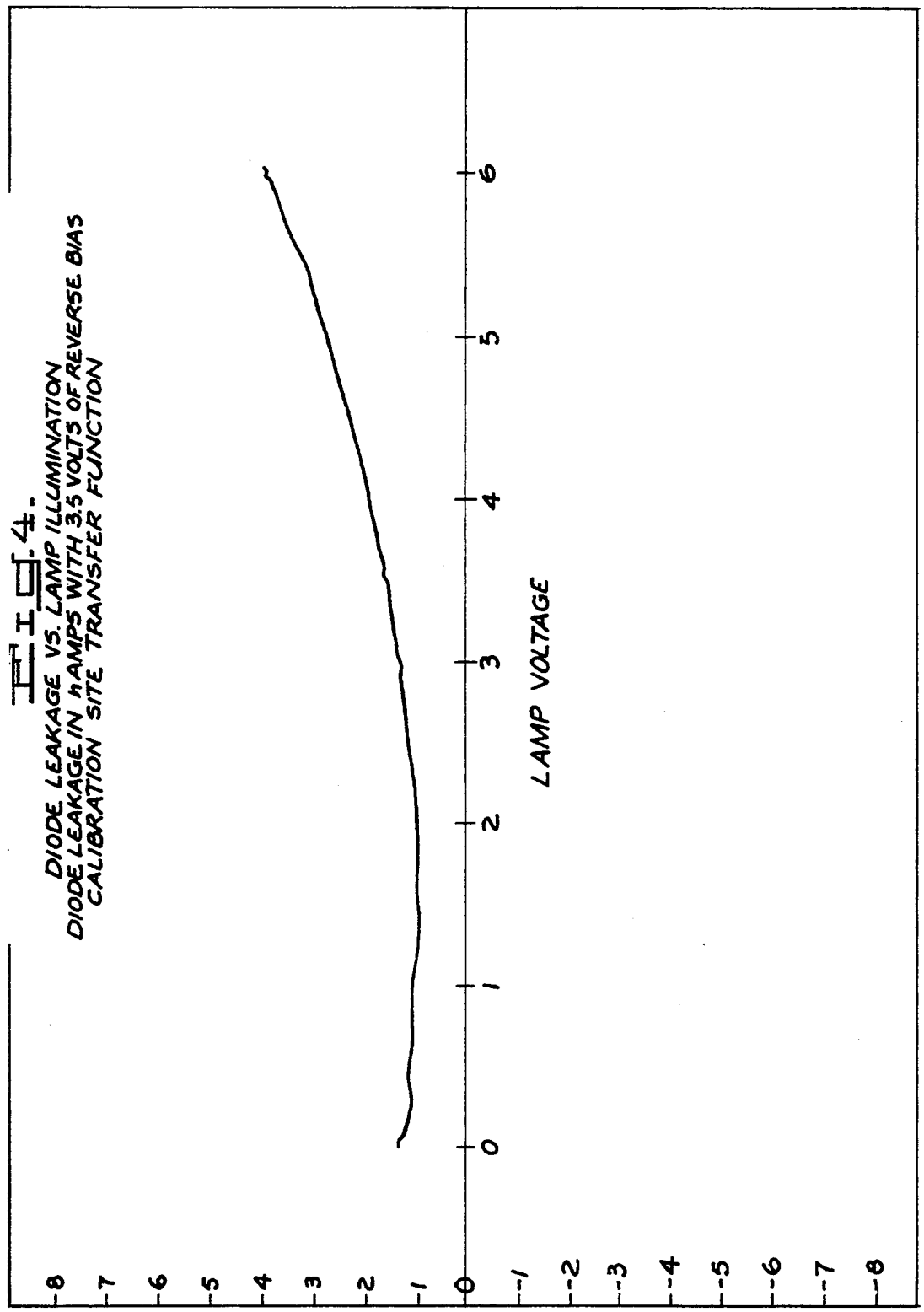

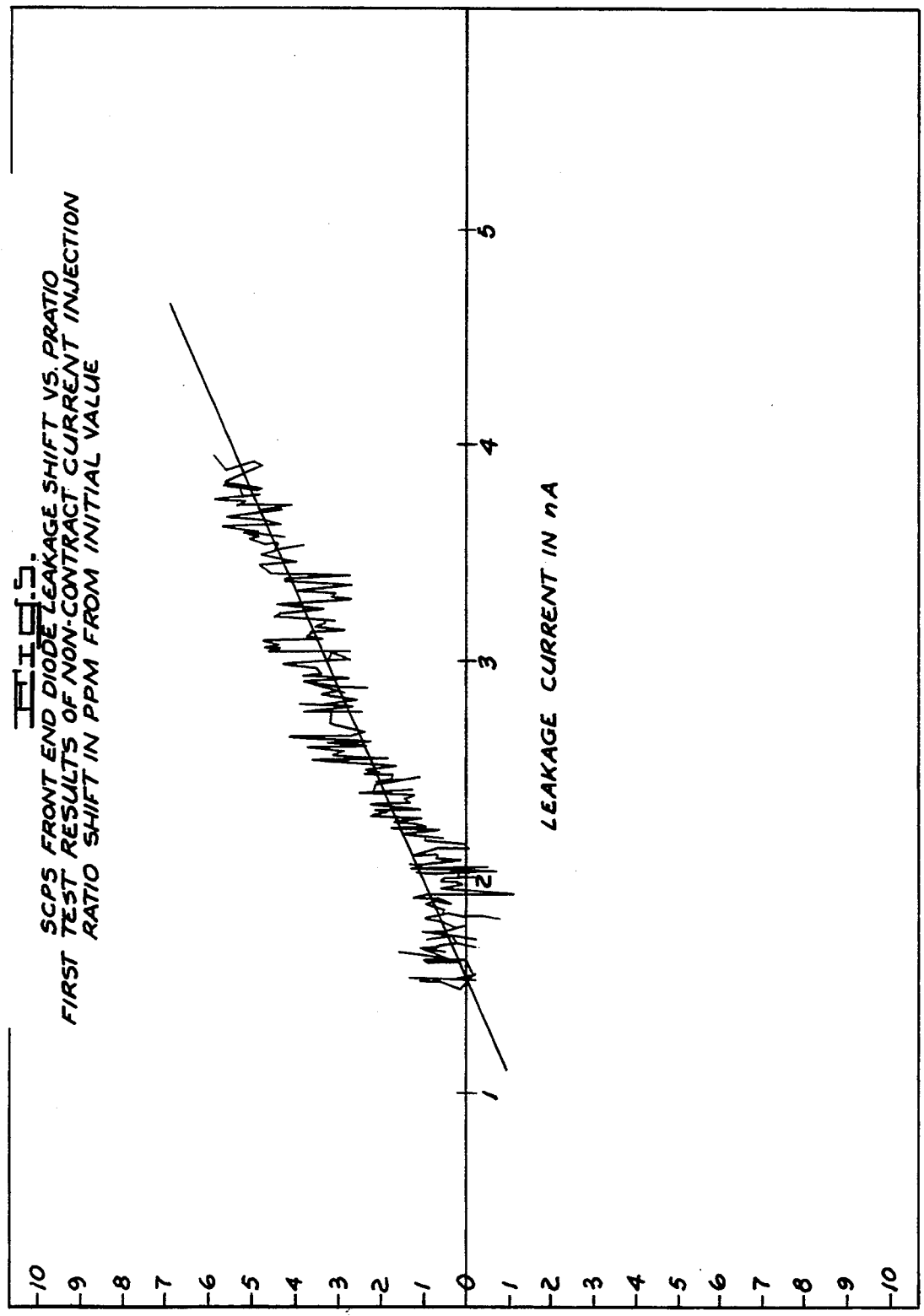

NON-CONTACT CURRENT INJECTION APPARATUS AND METHOD FOR USE WITH LINEAR BIPOLAR CIRCUITS

This is a continuation of patent application Ser. No. 07/999,610, filed Dec. 31, 1992, now abandoned.

BACKGROUND OF THE INVENTION

The present invention relates to a non-contact current injection apparatus and method for testing electronic circuits, particularly linear circuits.

Devices for testing electronic circuits are known in the art. Two such devices are illustrated by U.S. Pat. Nos. 4,768,073 to Adams and 4,912,052 to Miyoshi et al.

The Adams patent relates to a technique for testing integrated circuits prior to separation from a processed wafer. Each circuit has photoreceivers coupled via metallization tracks to an adjacent circuit. The receivers are used for the input of high speed optical test signals. The response of each circuit to the test signals is monitored. The intercircuit coupling tracks are severed when the wafer is scribed to separate the individual circuits.

The Miyoshi et al. patent relates to a method and an apparatus for measuring and testing the electric characteristic of a semiconductor device in a non-contact fashion. In accordance with the Miyoshi et al. invention, an electron beam is used to induce a voltage on a semiconductor device which is to be tested. The electric characteristic of the semiconductor device is determined by the changes that occur, with lapse of time, of the induced voltage. Thus, an electron beam is irradiated to an object to be tested to induce a voltage; and, thereafter, changes in the induced voltage are examined. Then, the electric characteristic of the semiconductor device is measured and tested from the voltage thus induced, and the voltage measured thereafter.

Linear circuits, which are realized with bipolar linear application specific integrated circuits (ASICs), are fundamentally current mode devices. Linear arrays make use of a regularly occurring pattern of identical NPN and PNP transistors which are personalized with an interconnect for a specific circuit application. Once fabricated, malfunctioning or parametrically faulty devices require micro-probing techniques to isolate and evaluate faulty circuit sections. Typical micro-probing debugging involves the observation of output responses while injecting externally generated signals into the ASIC nodes with micro-probes.

With the shrinkage of device feature size, increased density, and additional layers of metallization interconnect, it is becoming more and more difficult to physically access such nodes for debugging purposes. In addition, the number of probes required becomes cumbersome and restricts the level of the testing effort.

Accordingly, it is an object of the present invention to provide an improved method and apparatus for testing electronic integrated circuits.

It is another object of the present invention to provide an improved testing method and apparatus, which injects a calibrated signal into an electronic component forming part of an electronic circuit through non-contact optical means.

It is a further object to provide an improved method and apparatus, commensurate with the above-listed objects, which can take advantage of the matched electrical and optical properties of the components of a linear array.

The above and other objects and advantages of this invention will become more readily apparent when the following description is read in conjunction with the accompanying drawings.

SUMMARY OF THE INVENTION

A non-contact current injection apparatus, and a related method, are disclosed for use in testing linear bipolar electronic circuits.

In the preferred embodiment, the current injection apparatus comprises: an illumination source for emitting photons toward an electronic component at a desired site for inducing a current in the electronic component; a control loop for generating a voltage control signal which causes the illumination source to illuminate to a desired level; a feedback loop that monitors the current induced in the electronic component and compares it or some other end effect to a desired current or end effect; and a storage device for storing data to use in a calibration sequence. This apparatus can be calibrated by using the information generated about the end effect, produced by various degrees of illumination, and storing that information in the storage device - namely, a random access memory. After calibration of the apparatus has been completed, the apparatus can be used to test components in electronic circuits.

The method for testing electronic components, using the aforesaid apparatus, basically comprises: calibrating the apparatus by providing a test array having a series of calibration sites with a target at each site; providing an intensity control signal to a photon emission or illumination means; illuminating a first target at one of the calibration sites; and monitoring the end effect generated in said target by said illumination of the target. The preferred method further comprises injecting a current into an electronic component designed to achieve a desired end effect after the calibrating step has been completed and monitoring the end effect produced by said current.

BRIEF DESCRIPTION OF THE DRAWINGS

FIG. 3 is a schematic representation of a test circuit used as a test specimen in the apparatus of FIG. 2;

FIG. 4 illustrates a characteristic plot of diode leakage versus lamp illumination.

DETAILED DESCRIPTION OF THE PREFERRED EMBODIMENT

A photo-current can be produced in a reversed biased bipolar junction when a junction area is exposed to illumination. This diode reverse current is approximately linearly proportional to the incident illumination. In a bipolar transistor, this reverse current is generated in the base collector junction. Some of this base current will flow into the external emitter-base impedance. The residue current that flows into the intrinsic base is multiplied by beta and forms additional collector current. Thus, the operating point of a bipolar transistor can be modulated by photon injection.

In a linear array, the geometry, electrical and optical opacity of every N and P device on the array can be made equal. Therefore, if the photon transfer function of a calibration site device is found, the same calibration constants can be applied to other devices which have been personalized with an interconnect for a desired application.

The apparatus of the present invention (shown at 10 in FIG. 1) is capable of calibrating NPN and PNP devices in electronic circuits by injecting a current into the component and monitoring an end effect produced as a result of the current injection. After calibration is completed, the apparatus may be used to inject a predicted current into a circuit node through selective illumination and thereafter monitor a desired parameter to see if a desired end effect is achieved.

In the current injection apparatus 10, the injected current may be controlled by a single potentiometer and may be viewed on a panel meter. In addition, a low audio band width AC signal can be injected if desired. The injection of an AC signal for certain applications makes it possible to measure the inter-stage gains and transfer functions of buried ASIC cells without the use of micro probes.

Figure 1:
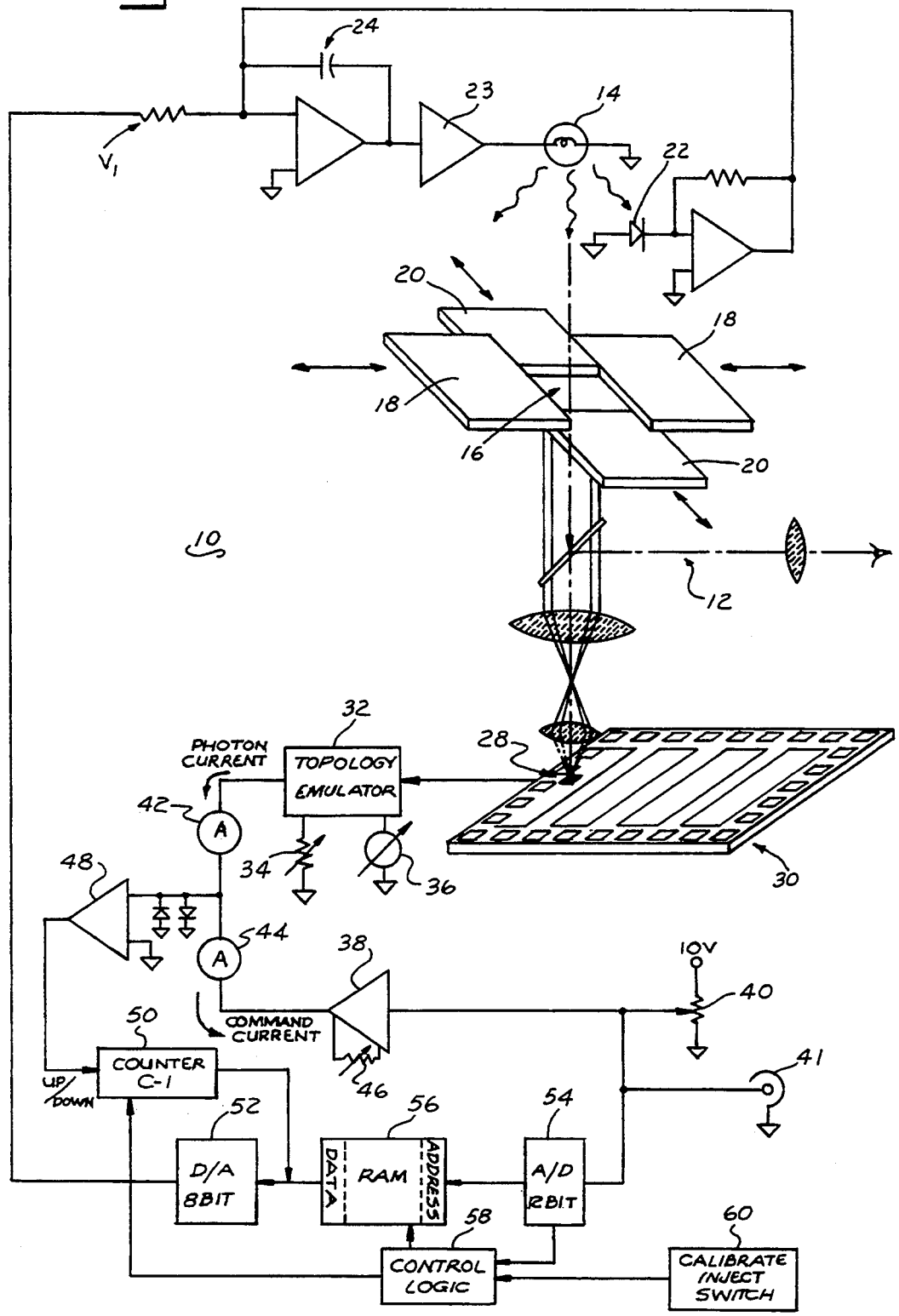
FIG. 1 is a schematic representation of a test apparatus in accordance with the present invention.

As shown in FIG. 1, the preferred apparatus 10 includes means for emitting photons at a selected target site. While the photon emitting means may comprise any suitable means known in the art, it employs a microprobing microscope 12 with a high intensity illumination source 14 for emitting photons which traverse the optical viewing path. The aperture 16, associated with the illumination source 14, can be controlled by knife edges 18 and 20. These edges 18, 20 respectively travel along a first axis (or X-axis) and a second axis (or Y-axis), which is transverse to the first axis to allow selective illumination of a target such as the collector base junction of a NPN or PNP device located at a calibration site. A photo-diode 22 is provided to monitor the level of illumination. The illumination source 14 is powered by a driver 23. An integrator 24 controls the driver 23 and closes a linear loop, which regulates the photon emission of the source to the value dictated by the control signal $V_1$.

If desired, a linear array 30 may be used to calibrate the apparatus 10 (see FIG. 1). The array may have a number of devices or electronic components 28 located at various calibration sites. Typically, these components have nodes that are brought out to test pads which could be bonded to package pins.

The illustrated apparatus 10 includes means 32 for establishing a circuit topology around the calibration site devices 28 and for most closely matching the operating parameters of the injection site. The circuit topology means 32 includes a variable resistor 34 and a variable voltage source 36. The conditions produced by the variable resistor 34 and the variable voltage source 36 preferably match the actual operating conditions of the device or circuit being tested.

The voltage control signal $V_1$ used to produce a certain level of illumination by the illumination source 14 is produced by a linear control loop. That loop includes a master current control potentiometer 40 which produces a DC voltage signal. The value of the signal produced by the potentiometer may be varied from a minimum value to a maximum value. When the apparatus 10 is in its calibration mode, the signal generated by the potentiometer 40 is passed to a 12-bit analog-to-digital converter 54 and then stored in a storage device 56, such as a random access memory device, operated by a control logic system 58. In a preferred embodiment of the present invention, the converter 54 comprises a fast successive approximation type converter.

The control logic system 58 preferably comprises a computer which accesses the storage device 56 to obtain control voltage versus illumination intensity mapping information to pass to an 8-bit digital to analog converter 52. The computer, through suitable programming, causes the voltage control signal $V_1$ to be generated from the information stored in the storage device 56. For example, the range of voltage on the illumination source may be 0 Volts to 5.0 Volts. The photon versus illumination voltage curve is not linear. Thus, if one half of the maximum illumination is desired, the control voltage may be 4.0 Volts rather than 2.5 Volts. If the computer is programmed to set the illumination to some percentage of full scale, it looks up the corresponding information in the storage device and sends that number to the converter 52.

The control signal $V_1$ generated by the control loop, as it leaves the memory storage device, is converted into an analog signal by the 8-bit digital to analog converter 52. After conversion, the signal is transmitted to the integrator/driver for powering the illumination source.

The voltage signal generated by the current control potentiometer 40 is also passed to a transconductance amplifier 38 set to a desired gain. A potentiometer 46 is provided to allow the gain of the amplifier 38 to be set at a desired level. The current signal emanating from the transconductance amplifier represents a commanded current to be produced at the calibration site. A meter 44 may be provided so that an operator may see the commanded current.

As previously discussed, the photon emission from the illumination source will create an induced current in the target electronic component at the calibration site. The current thus produced is monitored via the topology emulator 32 and a meter 42.

A first signal representative of the commanded current and a second signal representative of the induced current are passed to a comparator 48 which in turn formulates an error signal. The error signal is fed to a counter 50 which increases or decrease the control signal supplied to the digital to analog converter 52 in response to the error signal. In this manner, the signal $V_1$ is increased or decreased via the counter 50 until the error signal becomes zero, namely the induced current is equal to the commanded current.

For each setting of the current control potentiometer 40 used during the calibration sequence, the position of the potentiometer and the illumination level of the illumination source 14 needed to produce a desired end effect or current are stored in the memory device 56.

When it is desired to actually test an electronic component, a switch 60 in the control loop is operated to select an injection mode rather than a calibration mode. Thereafter, the computer control logic system 58 is used to select a data set from the information stored in the memory device. That set corresponds to a particular position for the potentiometer 40 based on the expected performance of the component being tested. Thereafter, a control signal $V_1$ is fed to the integrator/driver, the illumination source 14 is provided with the intensity dictated by the control signal and the end effect, such as the induced current, is monitored via the meters 42 and 44.

If desired, the control loop may include means 41 for inputting an AC signal such as a low audio band-width AC signal and superimposing the same over the DC signal produced by the potentiometer 40. As previously discussed, the injection of an AC signal for certain applications makes it possible to measure the interstage grains and transfer functions of buried ASIC cells without the use of micro probes.

Figure 2:
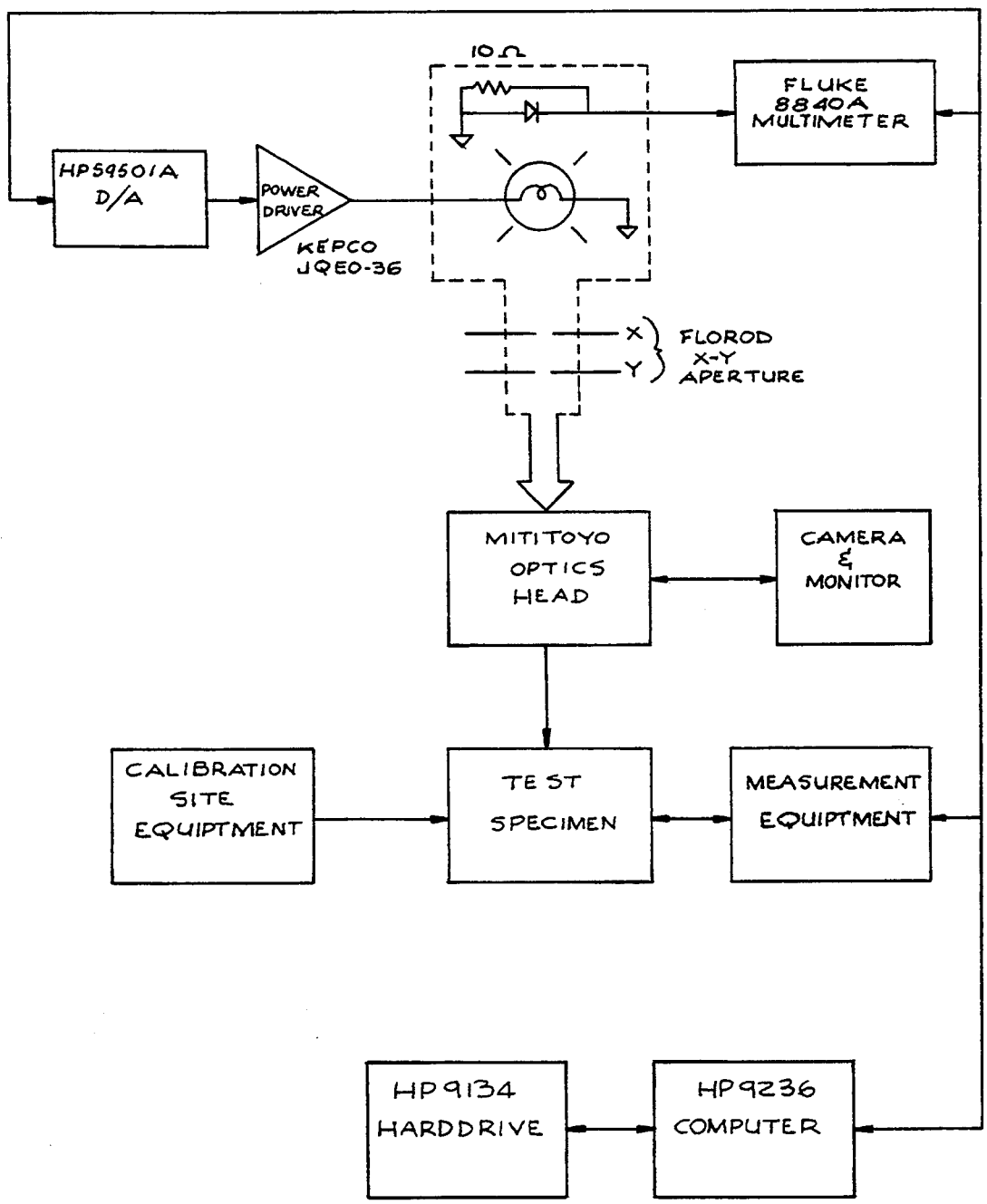
FIG. 2 is a schematic representation of a test apparatus used to prove the concept of the present invention.

To prove the concept of the technique of the present invention, tests were conducted using the setup shown in FIG. 2. The setup relies on computer controlled I.E.E.E. instrumentation bus equipment for maximum flexibility. The setup included a Mititoyo optics head to position the illumination source over the device of interest. It also included a camera and monitor for viewing purposes. One device which was tested using this setup was an oscillator type circuit.

As can be seen from FIG. 2, the test setup also included an illumination source, means for providing a voltage for driving the illumination source, a feedback path from that, and a photo-diode that monitors the level of the illumination source. In this setup, the loop is closed by measuring the output of the photo-diode and then adjusting the output of the D/A source to produce a consistent illumination level.

The Mititoyo optics head used in the setup of FIG. 2 allowed X-Y aperture adjustments so that photo emissions could be pinpointed onto a particular transistor in the oscillator circuit. During the test, an illumination level was provided which corresponded to a specific output frequency shift. The illumination level of the test site was controlled to give a percent shift from zero to one percent on this frequency. By varying the frequency by one percent, other parameters sensitive to frequency in the setup, such as circuit frequency, could be monitored. Therefore, without contacting the test specimen, parameters could be varied and other end effects or results could be examined as the parameters were varied.

In a second test, the device shown in FIG. 3 was used as the test specimen in the setup of FIG. 2. The circuit under test was designed to interface to two capacitors: one of which had a fixed value and the other which had a value which varied with air pressure. The capacitors were used to generate a frequency. This frequency was inversely proportional to the value of the capacitors. Hence, capacitor ratio and frequency ratio could be used interchangeably. U.S. Pat. No. 4,517,622 to Male, which is incorporated herein by reference, describes the architecture of this circuit.

During the test, a calibration sequence was first carried out in which the illumination source was used to illuminate a particular diode D5 in the circuit. The leakage current in the diode D5 was measured as a function of illumination level. The characteristic plot thus achieved is shown in FIG. 4. This characteristic plot was stored in the computer memory.

Figure 5:
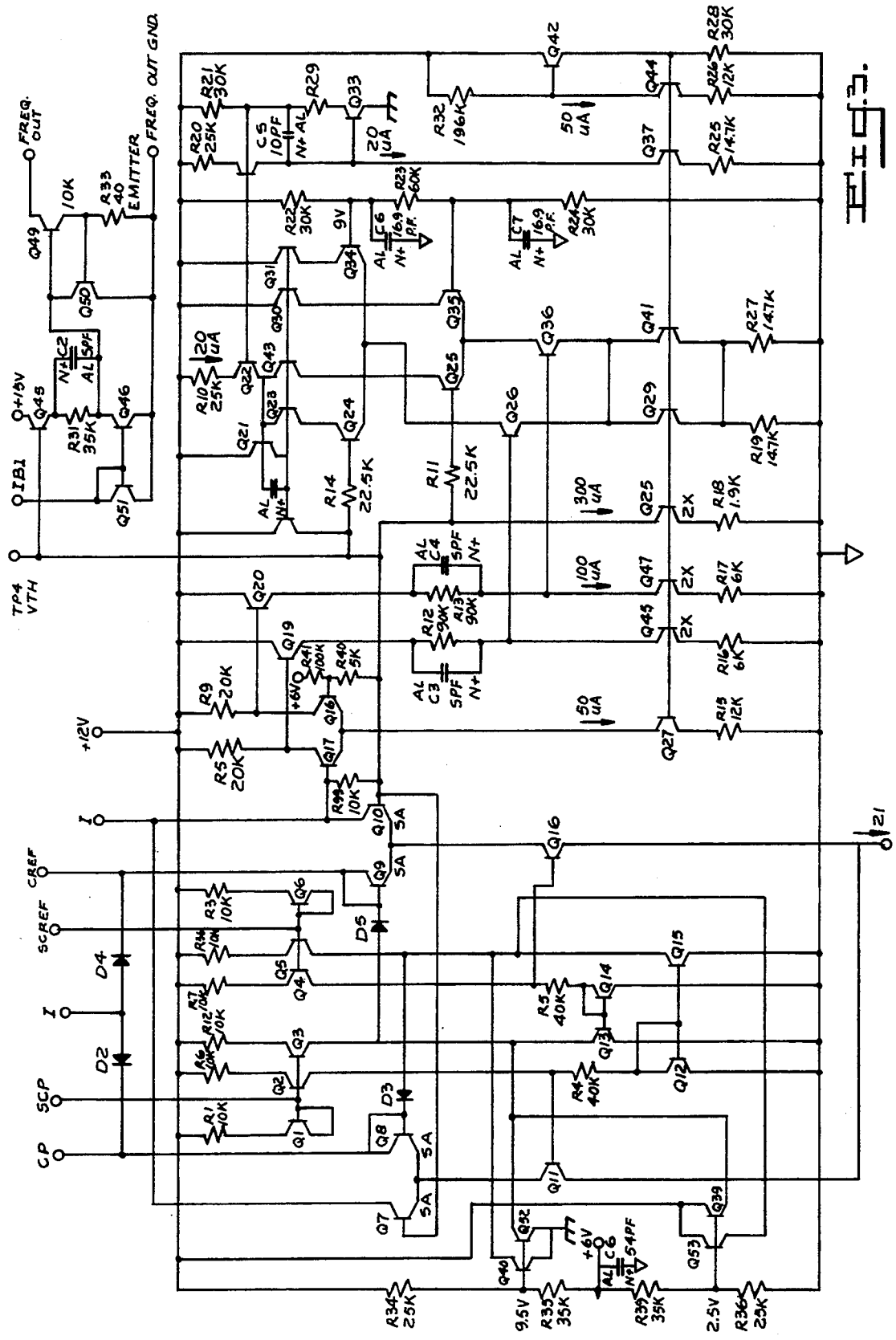
FIG. 5 illustrates a plot of frequency ratio versus diode leakage current.

After the calibration sequence was completed, a second mode was run where a given illumination was applied to the test specimen running in an actual application. The calibration information stored in the computer was then used to get an equivalent shift in a ratio parameter, as a frequency ratio is in the actual application versus a leakage current, which was set up by the illumination level in terms of the voltage on the illumination source. The resulting frequency ratio versus diode leakage current was derived by the computer. FIG. 5 illustrates the relationship between the frequency ratio and the diode leakage current in the terms of PRATIO (pressure ratio) versus diode leakage current.

While the present invention has been described in the context of calibrating to a particular parameter such as current, it should be recognized that the calibration could be to any desired end effect such as a frequency shift for a particular part. Of course, the apparatus of the present invention may have to be modified to monitor and measure the desired end effect.

It is apparent that there has been provided in accordance with this invention a non-contact current injection apparatus and a method for using the apparatus with linear bipolar circuits which fully satisfies the objects, means, and advantages set forth hereinbefore. While the invention has been described in combination with specific embodiments thereof, it is evident that many alternatives, modifications, and variations will be apparent to those skilled in the art in light of the foregoing description. Accordingly, it is intended to embrace all such alternatives, modifications, and variations as fall within the spirit and broad scope of the appended claims.

Having thus described the invention, what is claimed is:

1. A non-contact current injection apparatus for use in testing functional integrity of an electronic circuit, said apparatus comprising:
   means for illuminating with optical energy a predetermined location of said electronic circuit;
   means for generating a control signal, said illuminating means being responsive to said control signal for illuminating said predetermined location with a predetermined amount of said optical energy, said control signal being indicative of said predetermined amount of said optical energy;
   means for monitoring an end effect produced in said electronic circuit and for providing an actual signal indicative thereof; and
   means for comparing said actual signal to a desired signal indicative of a desired end effect produced in said electronic circuit, and for providing a difference signal indicative of any difference therebetween, said means for generating a control signal being responsive to said difference signal.

2. The apparatus of claim 1 further comprising linear loop means for measuring an actual amount of optical energy provided by said illuminating means and for comparing said actual amount of optical energy to said predetermined amount of optical energy as indicated by said control signal, and for adjusting said control signal based on any difference therebetween.

3. The apparatus of claim 2 wherein said illuminating means comprises a high intensity illumination source for emitting photons and means defining an aperture through which said photons emitted from said illumination source travel.

4. The apparatus of claim 3 wherein said aperture defining means comprises a first pair of knife edges which travel along a first axis and a second pair of knife edges which travel along a second axis substantially transverse to said first axis.

5. The apparatus of claim 3 wherein said linear loop means further comprises a driver for powering said illumination source and integrator means for controlling said driver.

6. The apparatus of claim 1 wherein said means for generating said control signal comprises a first current control means for generating a first current control signal and control loop means for generating said control signal as a function of said first current control signal.

7. The apparatus of claim 6 wherein said control loop means includes an analog to digital converter for converting said first current control signal into a corresponding digital first current control signal, a storage device for storing said digital first current control signal, control logic means for directing an operational sequence of said control loop means, and a digital to analog converter for converting said stored digital first current control signal into said control signal.

8. The apparatus of claim 7 wherein said control loop means further comprises means for switching said apparatus between a calibration mode and an injection mode.

9. The apparatus of claim 8 further comprising means for combining a second current control signal with said first current control signal.

10. The apparatus of claim 6 further comprising transconductance amplifier means for converting said first current control signal to a desired value of said control signal.

* * * * *